(12) United States Patent
Pugliese, Jr. et al.

(10) Patent No.: US 8,727,499 B2
(45) Date of Patent: May 20, 2014

(54) PROTECTING A FLUID EJECTION DEVICE RESISTOR

(75) Inventors: Roberto A. Pugliese, Jr., Tangent, OR (US); Timothy R. Emery, Corvallis, OR (US); Ed Friesen, Corvallis, OR (US); Rio Rivas, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 171 days.

(21) Appl. No.: 13/332,797

(22) Filed: Dec. 21, 2011

(65) Prior Publication Data

US 2013/0162724 A1     Jun. 27, 2013

(51) Int. Cl.
*B41J 2/05* (2006.01)
*H01L 21/02* (2006.01)
*G01D 15/00* (2006.01)
*G11B 5/127* (2006.01)

(52) U.S. Cl.
USPC .................................. 347/61; 438/21; 216/27

(58) Field of Classification Search
USPC .............................................. 347/61; 216/27
See application file for complete search history.

(56) References Cited

U.S. PATENT DOCUMENTS

| | | | |
|---|---|---|---|
| 5,658,471 A | 8/1997 | Murthy et al. | |
| 5,808,640 A | 9/1998 | Bhaskar et al. | |
| 6,945,634 B2 | 9/2005 | Pugliese, Jr. et al. | |
| 7,595,004 B2 | 9/2009 | Giovanola et al. | |
| 7,918,015 B2 | 4/2011 | Bell et al. | |
| 8,366,950 B2 * | 2/2013 | Chida et al. | 216/27 |

* cited by examiner

*Primary Examiner* — Lisa M Solomon
(74) *Attorney, Agent, or Firm* — Nathan R. Rieth

(57) ABSTRACT

In an embodiment, a method of fabricating a fluid ejection device includes forming a resistor on the front side of a substrate, depositing a dielectric film on the resistor to protect the resistor from chemical exposure during a slot formation process, and forming a slot in the substrate that extends from the back side to the front side of the substrate.

13 Claims, 5 Drawing Sheets

PROTECTING A FLUID EJECTION DEVICE RESISTOR

BACKGROUND

Some fluid ejection systems use heat from thermal resistors to eject fluid drops. For example, thermal inkjet printheads eject fluid ink drops from nozzles by passing electrical current through resistor elements. Heat from a resistor element creates a rapidly expanding vapor bubble that forces a small ink drop out of a firing chamber nozzle. When the resistor element cools, the vapor bubble quickly collapses and draws more fluid ink into the firing chamber in preparation for ejecting another drop from the nozzle. Fluid ink is drawn from a reservoir via a fluid slot that extends through the substrate on which the resistor and chamber are formed.

Improvements in the processes for fabricating fluid slots in fluid ejection devices have lead to narrower fluid slots that reduce device size and improve thermal efficiency. However, the improved processes have also been shown to etch or damage the surface of the resistors. Damage to the surface of the resistor can reduce device lifetime and cause fluid ejection defects (e.g., print defects in an inkjet printing system).

BRIEF DESCRIPTION OF THE DRAWINGS

The present embodiments will now be described, by way of example, with reference to the accompanying drawings, in which.

Throughout the drawings, identical reference numbers designate similar, but not necessarily identical, elements.

DETAILED DESCRIPTION

Overview

Figure 1:
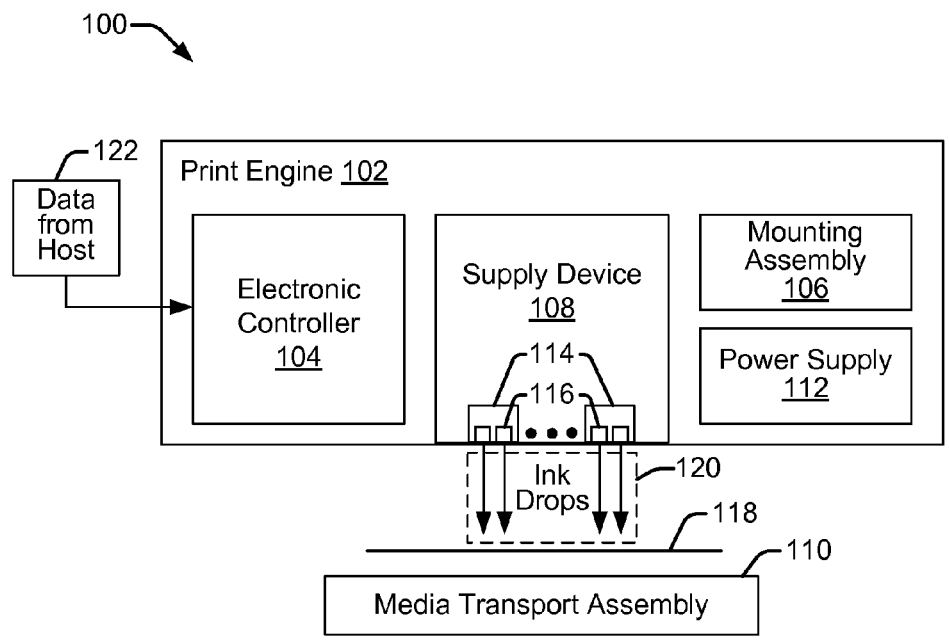
FIG. 1 shows an example of a fluid ejection system suitable for implementing a fluid ejection device having a dielectric protective film over a thermal resistor as disclosed herein, according to an embodiment.

As noted above, improved fluid slot fabrication processes in thermal resistor based fluid ejection devices can etch and damage the surface of thermal resistors, reducing device lifetime and causing operational deficiencies associated with the etch-induced defects in the resistor surfaces. Variations in the improved fluid slot fabrication processes include, for example, the use of fluorine-based chemistries for plasma etching of Si (silicon). Various types of resistor surfaces such as Ta (tantalum) resistor surfaces, for example, can be damaged by these and other improved slot fabrication processes. A thermal inkjet printer is an example of a system that implements fluid ejection devices (i.e., printheads) in which this type of damage to thermal firing resistor surfaces has been associated with reduced printhead life and print quality defects.

Embodiments of the present disclosure help to protect resistor surfaces during the formation of fluid slots in fluid ejection devices, generally, through the use of a dielectric protection layer (i.e., film) deposited over the resistor surface. Certain types of dielectric films deposited over the resistor surface prior to the formation of a slot in the device substrate help protect the resistor surface from damage that may otherwise occur from the chemical etching of the slot. The dielectric film can be deposited either before or after processing of an SU8 (or other) fluidics layer on top of the substrate surface. The film can then be stripped off the resistor after fabrication of the fluid ejection device is completed (e.g., using a BOE-buffered oxide etch, or other etch), or it can be left on the resistor surface and shipped with the finished product.

In one example embodiment, a method of fabricating a fluid ejection device includes forming a resistor on the front side of a substrate. A dielectric film is then deposited on the resistor to protect the resistor from chemical exposure during a slot formation process. A slot is then formed in the substrate, extending from the back side to the front side of the substrate. In different implementations the film is deposited using atomic layer deposition (ALD) and plasma enhanced chemical vapor deposition (PECVD) techniques.

In another example embodiment, a method of fabricating a fluid ejection device includes forming a resistor on the front side of a substrate and then forming a patterned fluidics layer on the front side of the substrate over the resistor. A dielectric film is deposited over the fluidics layer such that the film enters a chamber of the fluidics layer and covers the surface of the resistor. The dielectric film is to protect the resistor from chemical exposure during a slot formation process. The dielectric film is deposited through the SU8 fluidics layer using a gas phase deposition process. A slot is then formed in the substrate from the back side to the front side of the substrate. In different implementations the dielectric film is deposited using low temperature atomic layer deposition (ALD) and low temperature plasma enhanced chemical vapor deposition (PECVD), so as to avoid degradation of the SU8 fluidics layer.

In another example embodiment, a fluid ejection device includes a slot that extends from a back side to a front side of a substrate, a resistor formed on the front side of the substrate, and a dielectric film over the resistor to protect the resistor surface from chemical exposure during fabrication of the slot. In different implementations the dielectric film can be a dielectric material including hafnium oxide, titanium oxide, aluminum oxide, hafnium silicon nitride, silicon oxide or silicon nitride.

Illustrative Embodiments

FIG. 1 shows an example of a fluid ejection system 100 suitable for implementing a fluid ejection device having a dielectric protective film over a thermal resistor as disclosed herein, according to an embodiment of the disclosure. In this example, the fluid ejection system 100 is embodied as an inkjet printing system 100 that includes a print engine 102 having a controller 104, a mounting assembly 106, one or more replaceable fluid supply devices 108 (e.g., FIG. 2), a media transport assembly 110, and at least one power supply 112 that provides power to the various electrical components of inkjet printing system 100. The inkjet printing system 100 further includes one or more fluid ejection devices 114 implemented as printheads 114 that eject drops of ink or other fluid through a plurality of nozzles 116 (also referred to as orifices or bores) toward print media 118 so as to print onto the media 118. In some embodiments a printhead 114 may be an integral part of a supply device 108, while in other embodiments a printhead 114 may be mounted on a print bar (not shown) of mounting assembly 106 and coupled to a supply device 108 (e.g., via a tube). Print media 118 can be any type of suitable sheet or roll material, such as paper, card stock, transparencies, Mylar, polyester, plywood, foam board, fabric, canvas, and the like.

In the FIG. 1 embodiment, printhead 114 is a thermal-inkjet (TIJ) printhead 114. In TIJ printheads 114, electric current is passed through a resistor element to generate heat in an ink-filled chamber. Referring briefly now to both FIGS. 1 and 3, the heat vaporizes a small quantity of ink or other fluid 320, creating a rapidly expanding vapor bubble 322 that forces a fluid drop 324 out of a nozzle 116. As the resistor element cools the vapor bubble collapses, drawing more fluid from a reservoir into the chamber in preparation for ejecting another drop through the nozzle 116. Nozzles 116 are typically arranged in one or more columns or arrays along printhead 114 such that properly sequenced ejection of ink from nozzles 116 causes characters, symbols, and/or other graphics or images to be printed on print media 118 as the printhead 114 and print media 118 are moved relative to each other.

Mounting assembly 106 positions printhead 114 relative to media transport assembly 110, and media transport assembly 110 positions print media 118 relative to printhead 114. Thus, a print zone 120 is defined adjacent to nozzles 116 in an area between printhead 114 and print media 118. In one embodiment, print engine 102 is a scanning type print engine. As such, mounting assembly 106 includes a carriage for moving printhead 114 relative to media transport assembly 110 to scan print media 118. In another embodiment, print engine 102 is a non-scanning type print engine. As such, mounting assembly 106 fixes printhead 114 at a prescribed position relative to media transport assembly 110 while media transport assembly 110 positions print media 118 relative to printhead 114.

Electronic controller 104 typically includes components of a standard computing system such as a processor, memory, firmware, and other printer electronics for communicating with and controlling supply device 108, printhead 114, mounting assembly 106, and media transport assembly 110. Electronic controller 104 receives data 122 from a host system, such as a computer, and temporarily stores the data 122 in a memory. Data 122 represents, for example, a document and/or file to be printed. Thus, data 122 forms a print job for inkjet printing system 100 that includes one or more print job commands and/or command parameters. Using data 122, electronic controller 104 controls printhead 114 to eject ink drops from nozzles 116 in a defined pattern that forms characters, symbols, and/or other graphics or images on print medium 118.

Figure 2:
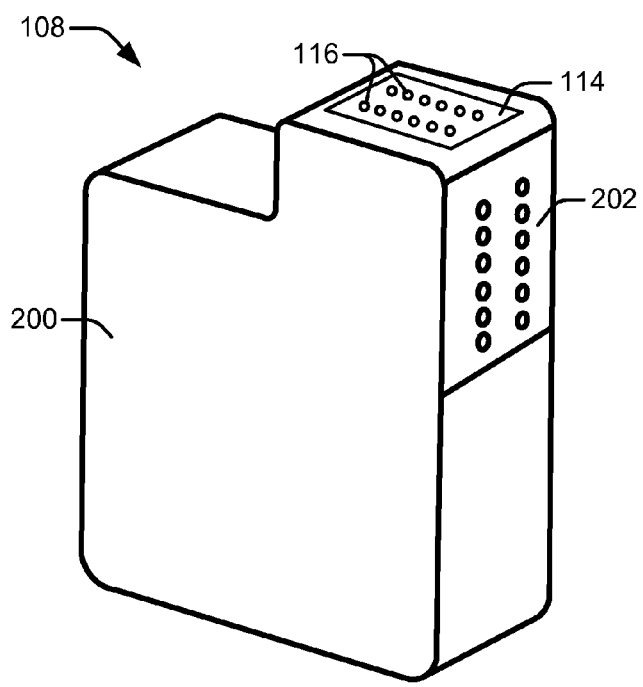
FIG. 2 shows an example of a fluid supply device implemented as an ink cartridge, according to an embodiment.

FIG. 2 shows an example of a fluid supply device 108 implemented as an ink cartridge 108, according to an embodiment of the disclosure. The ink cartridge supply device 108 generally includes a cartridge body 200, printhead 114, and electrical contacts 202. Individual fluid drop generators within printhead 114 are energized by electrical signals provided at contacts 202 to eject fluid drops from selected nozzles 116. The fluid can be any suitable fluid used in a printing process, such as various printable fluids, inks, pre-treatment compositions, fixers, and the like. In some examples, the fluid can be a fluid other than a printing fluid. The supply device 108 may contain its own fluid supply within cartridge body 200, or it may receive fluid from an external supply (not shown) such as a fluid reservoir connected to device 108 through a tube, for example. Ink cartridge supply devices 108 containing their own fluid supplies are generally disposable once the fluid supply is depleted.

Figure 3:
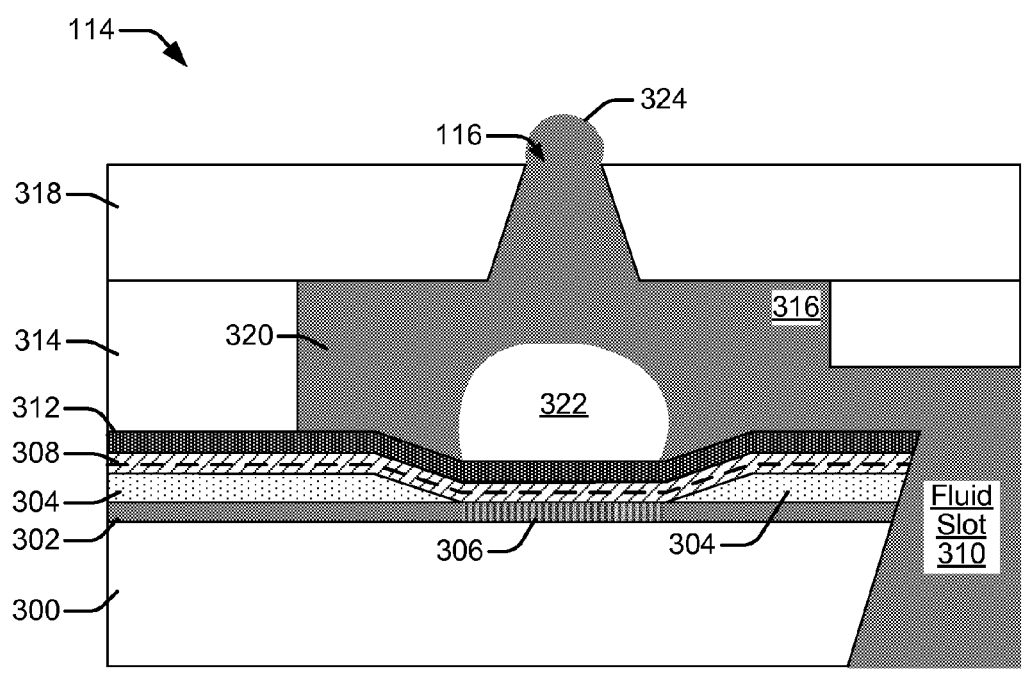
FIG. 3 shows a partial cross-sectional view of an example TIJ printhead that employs a dielectric film over a thermal resistor to protect the resistor surface from damage during a fluid slot formation process, according to an embodiment.

FIG. 3 shows a partial cross-sectional view of an example TIJ printhead 114 that employs a dielectric film over a thermal resistor to protect the resistor surface from damage during a fluid slot formation process, according to an embodiment of the disclosure. The TIJ printhead 114 includes a substrate 300 typically made of silicon (Si), or another appropriate material such as glass, a semiconductive material, various composites, and so on. A stack of thin film materials on the substrate 300 and the formation of a fluid slot through the substrate and the thin film stack provide functionality to the printhead 114. The thin film stack may include a sealant or capping layer (not shown) over the substrate such as a thermally grown field oxide and an insulating glass layer deposited, for example, by PECVD techniques. The capping layer forms an oxide underlayer for the thermal resistor layer 302. Thermal/firing resistors are formed by depositing (e.g., by sputter deposition) resistor layer 302 over the substrate 300. The resistor layer 302 is typically on the order of about 0.1 to 0.75 microns thick, and can be formed of various suitable resistive materials including, for example, tantalum aluminum, tungsten silicon nitride, nickel chromium, carbide, platinum and titanium nitride. Resistor layers having other thicknesses are also within the scope of this disclosure.

A conductive layer 304 is deposited (e.g., by sputter deposition techniques) on resistive layer 302 and patterned (e.g., by photolithography) and etched to form conductor traces 304 and an individually formed resistor 306 from the underlying resistive layer 302. Conductive traces 304 can be made of various materials including, for example, aluminum, aluminum/copper alloy, copper, gold, and so on. One or more additional overcoat layers 308 (shown in FIG. 3 as layer 308 divided by a dashed line) can be formed over the resistor 306 to provide additional structural stability and electrical insulation from fluid in the firing chamber. Overcoat layers 308 are generally considered to be part and parcel of resistor 306, and, as such, they provide a final layer to resistor 306. Overcoat layers 308 typically include an insulating passivation layer formed over the resistor 306 and the conductor traces 304 to prevent electrical charging of the fluid or corrosion of the device in the event that an electrically conductive fluid is used. A passivation layer has a thickness on the order of about 0.1 to 0.75 microns, but may have other thicknesses, and may be formed (e.g., by sputtering, evaporation, PECVD) of suitable materials such as silicon dioxide, aluminum oxide, silicon carbide, silicon nitride, and glass. Overcoat layers 308 also include a cavitation barrier layer over the passivation layer that helps dissipate the force of the collapsing drive bubble left in the wake of each ejected fluid drop. The cavitation layer has a thickness on the order of about 0.1 to 0.75 microns but it may also have a greater or lesser thickness, and it is often, but not necessarily, formed of tantalum deposited by a sputter deposition technique.

The cavitation layer is generally considered to be the final layer of resistor 306 and therefore makes up the surface of the resistor 306. As noted above, certain fluid slot fabrication processes can etch and damage the surface of these resistors. The fluid slot 310 is formed in the substrate 300 by processes that include, for example, a laser ablation step followed by a non-isotropic wet etch step using chemicals such as potassium hydroxide (KOH) or tetramethylammonium hydroxide (TMAH). The laser ablation step micromachines a deep trench in the substrate 300, starting at the bottom of the substrate and proceeding up through the substrate to remove a bulk portion of the substrate. The wet etch step generally completes formation of the laser deep trench by both removing the substrate 300 from the frontside where thinfilm layers 302, 304 and 308 have been previously removed and removing the substrate 300 proceeding from the backside of the deep laser trench. Another more recent slot formation process includes a laser ablation step, followed by a dry etch step, followed by a wet etch step. The laser ablation step, again, forms a deep trench by micromachining from the bottom of the substrate 300. The dry etch step proceeds from the backside to remove the remaining substrate 300 in the deep laser trench until a through slot is formed at a location where thin film layers 302, 304 and 308 have been previously removed. The wet etch step then removes additional substrate material 300 and forms a final slot geometry. In other implementations, a through slot is formed by a dry etch process that removes substrate 300 proceeding from the backside and continuing to the front side where thin film layers 320, 304 and 309 have been removed.

The more recently developed slot formation processes enable a narrower fluid slot that helps reduce the size of the printhead 114 and provides improved thermal efficiency. However, the dry etch step included in these processes can use fluorine-based chemistries such as sulfur hexafluoride (SF6) for plasma etching the Si substrate. These and other chemistries used in more recent slot formation processes can etch and damage the surface of the resistors 306. The etching and damage of the surface of the resistor 306 occurs after the dry etch forms the through slot and the fluorine-based chemistries then flow into the chamber region.

Accordingly, as shown in FIG. 3, the TIJ printhead 114 also includes a protective dielectric film 312 over the resistor 306 to protect the resistor surface from chemical exposure during fabrication of the slot 310. In different implementations, and depending to some degree on the method of deposition employed as discussed below, the dielectric film 312 can be a dielectric material including hafnium oxide, titanium oxide, aluminum oxide, hafnium silicon nitride, silicon oxide or silicon nitride. While the dielectric film 312 is deposited over the completed resistor 306 prior to the slotting process, it can be deposited either before or after the processing of the fluidics layer 314 formed on the top of the substrate 300.

The fluidics layer 314 is typically a patterned SU8 layer formed onto the top of substrate 300 as a dry film laminated by heat and pressure, for example, or as a wet film applied by spin coating. SU8 is a photoimageable negative acting epoxy, and the chambers 316 (and other channels/passageways) are formed in the fluidics layer 314 by common photo imaging techniques. A nozzle layer 318 includes nozzles (orifices) 116 formed over respective chambers 316 such that each chamber 316, associated nozzle 116, and associated thermal resistor 306 are aligned. In some implementations the fluidics layer 314 and nozzle layer 318 are integrated as a single structure formed of SU8 or another appropriate material.

Figure 4:
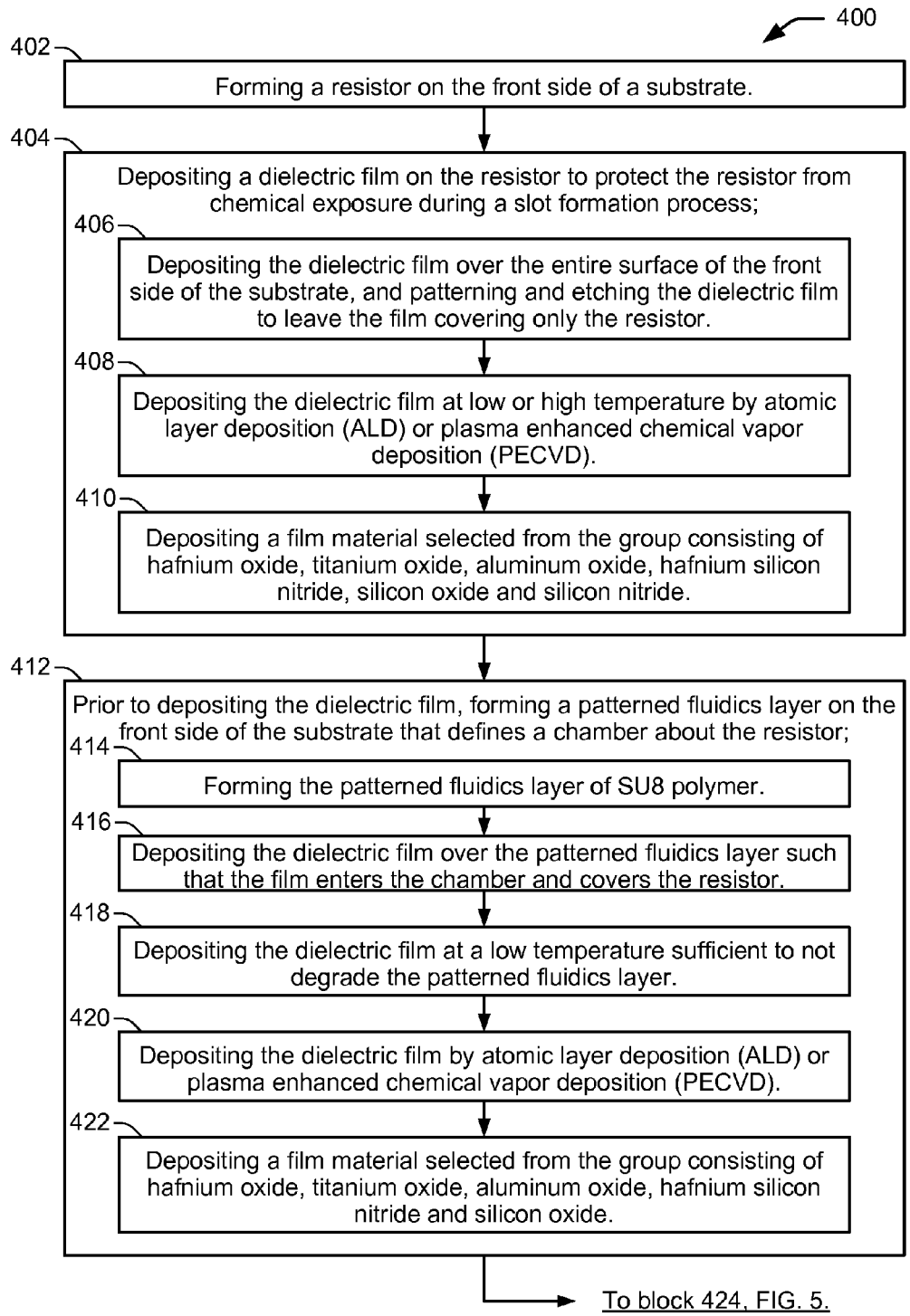
FIGS. 4 and 5 show a flowchart of an example method of fabricating a fluid ejection device, according to an embodiment.

FIG. 4 shows a flowchart of an example method 400 of fabricating a fluid ejection device, according to an embodiment of the disclosure. Method 400 is associated with the embodiments of fluid ejection devices 114 (e.g., TIJ printheads 114) and related systems and components discussed above with respect to illustrations in FIGS. 1-3. Although method 400 includes steps listed in a particular order, it is to be understood that this does not necessarily limit the steps to being performed in this or any other particular order. In general, in addition to the fabrication techniques specifically called out in the method 400, the steps of method 400 may be performed using various precision microfabrication techniques such as electroforming, laser ablation, anisotropic etching, sputtering, dry etch, wet etch and photolithography, as are well-known to those skilled in the art.

The method 400 of fabricating a fluid ejection device begins at block 402 with forming a resistor 306 on the front side of a substrate 300. The resistor 306 can be formed by sputter deposition, for example, and can be formed of various materials and thicknesses as noted above. Formation of the resistor 306 typically includes the deposition of one or more overcoat layers 308, which include a final layer of the resistor 306 referred to as a cavitation barrier layer made of tantalum, for example.

The method 400 continues at block 404 with depositing a dielectric film 312 on the resistor 306 to protect the resistor from chemical exposure during a subsequent slot formation process. In one implementation, as shown at block 406, depositing the dielectric film can include depositing the dielectric film over the entire surface of the front side of the substrate, and then patterning and etching the dielectric film to leave the dielectric film covering only the resistor 306. In this implementation, the dielectric film can be deposited at low or high temperature (relative to the cure temperature of SU8) by atomic layer deposition (ALD) or by plasma enhanced chemical vapor deposition (PECVD), as shown at block 408. If the dielectric film is to be subsequently removed after formation of the slot, then a typical size of the patterned dielectric film extends just beyond the size of the resistor to provide complete resistor surface protection. The formation of the fluidics layer (at block 412, below) slightly overlaps the dielectric film such that when the dielectric film is removed then only a small portion of the fluidics layer is undercut. If the dielectric layer is to remain on a completed printhead then the dielectric layer may extend to a larger size. Depending at least in part on the deposition technique used and the temperature of the deposition, the dielectric film can be a material selected from the group of materials including hafnium oxide, titanium oxide, aluminum oxide, hafnium silicon nitride, silicon oxide and silicon nitride, as shown at block 410.

The method 400 continues at block 412 with, prior to depositing the dielectric film, forming a fluidics layer 314 on the front side of the substrate 300. The fluidics layer 314 is generally patterned to define a chamber 316 about the resistor 306, and may be further patterned to include various fluid channels throughout the fluidics layer 314. Thus, in this implementation the dielectric film is not deposited over the entire substrate 300 as in the case noted above at block 406. As shown at block 414, the patterned fluidics layer 314 can be formed of photoimageable SU8 epoxy. In this implementation, the dielectric film is deposited through the patterned fluidics layer (e.g., the chamber 316), as shown at block 416. More specifically, the film is deposited over the nozzle layer 318 and enters a respective chamber 316, covering the resistor 306. Because the dielectric film is deposited through the patterned fluidics layer 314, the film is deposited at a low enough temperature that it does not degrade the patterned fluidics layer (typically an SU8 epoxy), as shown at block 418. The dielectric film can be deposited through the fluidics layer 314 (at low temperature) by atomic layer deposition (ALD) or plasma enhanced chemical vapor deposition (PECVD), and can be a material selected from the group of materials including hafnium oxide, titanium oxide, aluminum oxide, hafnium silicon nitride and silicon oxide, as shown at blocks 420 and 422. In another implementation, where the nozzle layer is formed from materials such as silicon oxide, silicon carbide, silicon nitride or a metal, the deposition temperature of the dielectric film is higher than the cure temperature of SU8, which enables the formation of a higher quality film.

Figure 5:
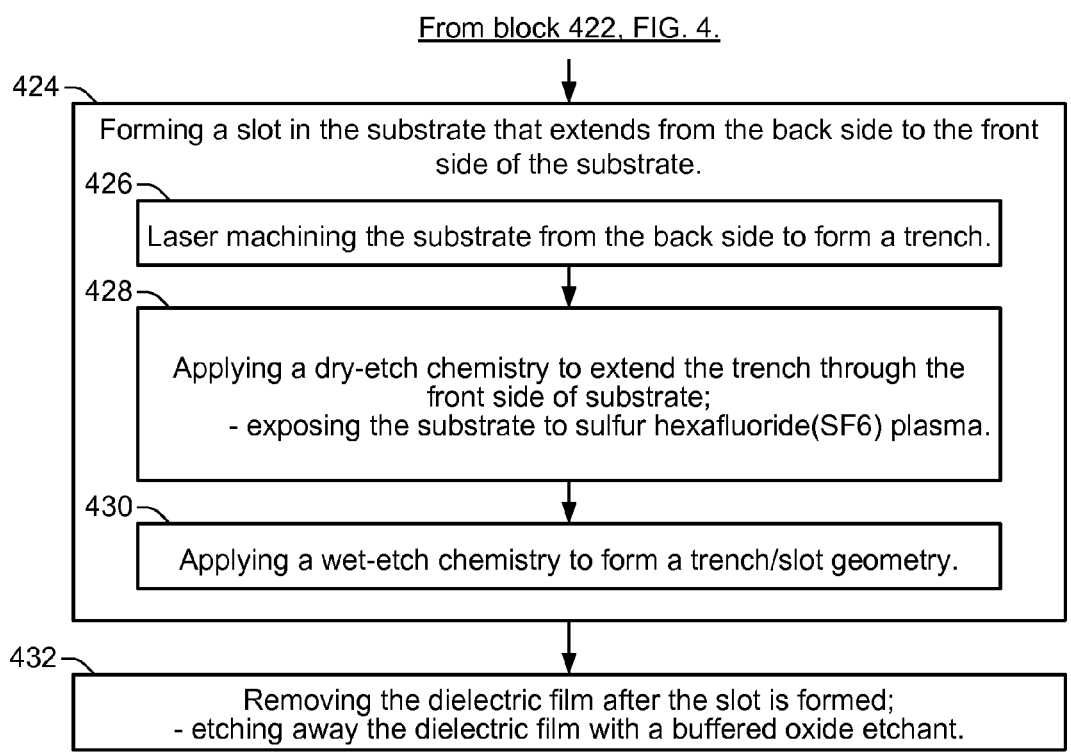

The method 400 continues at block 424 of FIG. 5, with forming a fluid slot 310 in the substrate 300 that extends from the back side to the front side of the substrate. The slot can be formed in several steps including a laser machining step to ablate and melt the substrate from the back side to form a trench (block 426), a dry-etch/plasma step which applies a dry-etch chemistry to extend the trench through the front side of substrate (block 428), and a wet-etch step which applies a wet-etch chemistry to form the final through slot geometry (block 430). The dry-etch step can include, in one example implementation, exposing the substrate to sulfur hexafluoride (SF6) plasma.

In some implementations, as shown at block 432, the dielectric film can be removed after the slot is formed. The dielectric film can be removed, for example, by etching it away with a buffered oxide etchant.

Figure 6:
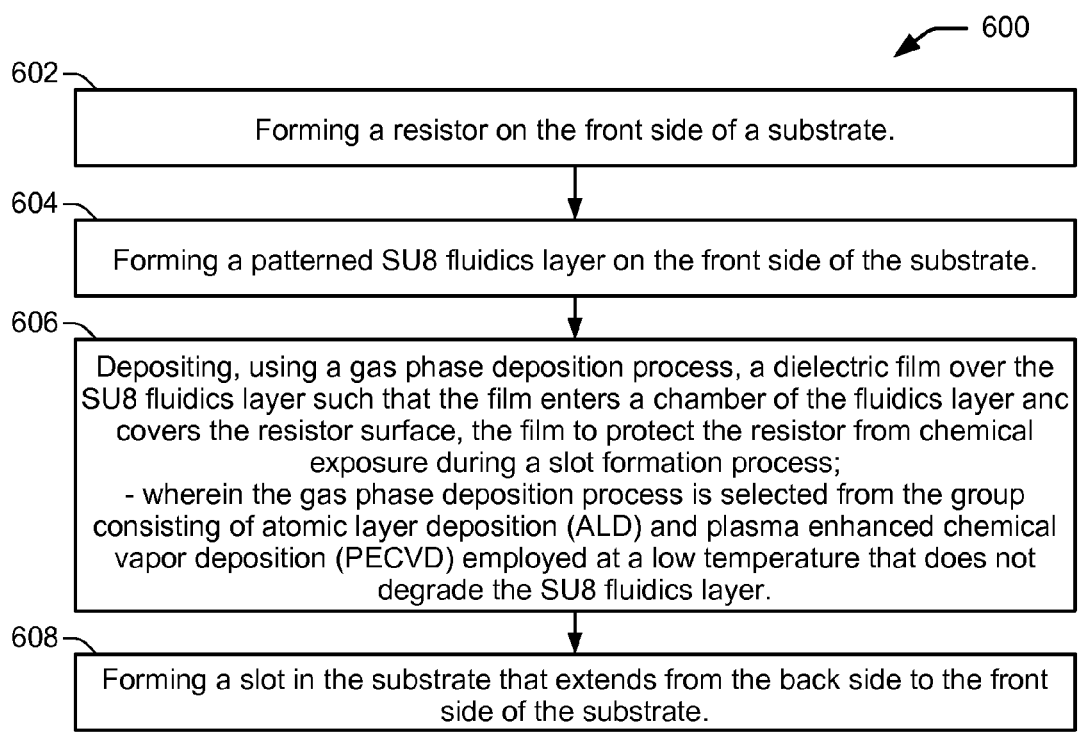
FIG. 6 shows a flowchart of another example method of fabricating a fluid ejection device, according to an embodiment.

FIG. 6 shows a flowchart of an example method 600 of fabricating a fluid ejection device, according to an embodiment of the disclosure. Method 600 is associated with the embodiments of fluid ejection devices 114 (e.g., TIJ printheads 114) and related systems and components discussed above with respect to illustrations in FIGS. 1-3. Although method 600 includes steps listed in a particular order, it is to be understood that this does not necessarily limit the steps to being performed in this or any other particular order. In general, in addition to the fabrication techniques specifically called out in the method 600, the steps of method 600 may be performed using various precision microfabrication techniques such as electroforming, laser ablation, anisotropic etching, sputtering, dry etch, wet etch and photolithography, as are well-known to those skilled in the art.

The method 600 of fabricating a fluid ejection device begins at block 602 with forming a resistor 306 on the front side of a substrate 300. As noted in method 400 above, resistor 306 can be formed by a sputter deposition technique of various materials and thicknesses, and typically includes one or more overcoat layers 308 including a final cavitation barrier layer. The method 600 continues at block 604 with forming a patterned fluidics layer 314 (e.g., a patterned SU8 fluidics layer) on the front side of the substrate. The fluidics layer forms a chamber about the resistor. As shown at block 606, a dielectric film 312 is deposited over the fluidics layer such that the film enters a chamber of the fluidics layer and covers the surface of the resistor. The dielectric film is to protect the resistor from chemical exposure during a subsequent slot formation process. The gas phase deposition process can be atomic layer deposition (ALD) or plasma enhanced chemical vapor deposition (PECVD) employed at a low temperature that does not degrade the SU8 fluidics layer. After deposition of the dielectric film 312, a fluid slot 310 is formed in the substrate that extends from the back side to the front side of the substrate. In general, as noted above, the dielectric film 312 protects the surface of resistor 306 from the etch chemistries (e.g., SF6) used in the slot formation process.

What is claimed is:

1. A method of fabricating a fluid ejection device comprising:
   forming a resistor on the front side of a substrate;
   forming a fluidics layer on the front side of the substrate that defines a chamber about the resistor;
   depositing a dielectric film on the resistor through the chamber of the fluidics layer to protect the resistor from chemical exposure during a slot formation process; and
   forming a slot in the substrate that extends from the back side to the front side of the substrate.

2. A method as in claim 1, wherein depositing the dielectric film comprises depositing the dielectric film at a temperature sufficient to not degrade the fluidics layer.

3. A method as in claim 2, wherein depositing the dielectric film comprises depositing the dielectric film by a technique selected from the group consisting of atomic layer deposition (ALD) and plasma enhanced chemical vapor deposition (PECVD).

4. A method as in claim 1, wherein forming the fluidics layer comprises forming the fluidics layer of SU8 epoxy.

5. A method as in claim 1, wherein depositing the dielectric film comprises:
   depositing the dielectric film over the entire surface of the front side of the substrate; and
   patterning and etching the dielectric film to leave the film covering only the resistor.

6. A method as in claim 5, wherein depositing the dielectric film over the entire surface comprises depositing the dielectric film by a technique selected from the group consisting of atomic layer deposition (ALD) and plasma enhanced chemical vapor deposition (PECVD).

7. A method as in claim 1, wherein depositing the dielectric film comprises depositing a film material selected from the group consisting of hafnium oxide, titanium oxide, aluminum oxide, hafnium silicon nitride, silicon oxide and silicon nitride.

8. A method as in claim 1, wherein forming the slot comprises:
   laser machining the substrate from the back side to form a trench;
   applying a dry-etch chemistry to extend the trench through the front side; and
   applying a wet-etch chemistry to form a trench geometry.

9. A method as in claim 8, wherein applying a dry-etch chemistry comprises:
   exposing the substrate to a sulfur hexafluoride (SF6) plasma; and
   exposing the substrate to a xenon difluoride (XeF2) plasma after the SF6 plasma.

10. A method as in claim 1, further comprising removing the dielectric film after the slot is formed.

11. A method as in claim 10, wherein removing the dielectric film comprises etching away the dielectric film with a buffered oxide etchant.

12. A method of fabricating a fluid ejection device comprising:
   forming a resistor on the front side of a substrate;
   forming a patterned fluidics layer on the front side of the substrate;
   depositing a dielectric film over the fluidics layer such that the film enters a chamber of the fluidics layer and covers the surface of the resistor, the film to protect the resistor from chemical exposure during a slot formation process; and
   forming a slot in the substrate that extends from the back side to the front side of the substrate.

13. A method as in claim 12, wherein the gas phase deposition process is selected from the group consisting of atomic layer deposition (ALD) and plasma enhanced chemical vapor deposition (PECVD) employed at a low temperature that does not degrade the SU8 fluidics layer.

\* \* \* \* \*